United States Patent [19]

Janko et al.

[11] Patent Number: 4,963,821

[45] Date of Patent: Oct. 16, 1990

[54] PROBE AND METHOD FOR TESTING A POPULATED CIRCUIT BOARD

[75] Inventors: Bozidar Janko, Portland; Zoran O. Sekulic, Beaverton, both of Oreg.; Mark F. Bitetto, Sumner, Wash.

[73] Assignee: Tektronix, Inc., Beaverton, Oreg.

[21] Appl. No.: 338,786

[22] Filed: Apr. 14, 1989

Related U.S. Application Data

[63] Continuation-in-part of Ser. No. 338,712, Apr. 14, 1989.

[51] Int. Cl.⁵ .................... G01R 31/02; G01R 1/06
[52] U.S. Cl. .................... 324/158 P; 324/158 F; 324/72.5
[58] Field of Search ........... 324/158 F, 158 P, 73 PC, 324/72.5; 361/386, 387, 398; 439/482

[56] References Cited

U.S. PATENT DOCUMENTS

| | | | |
|---|---|---|---|
| 3,596,228 | 7/1971 | Reed, Jr. ................ | 324/158 P |
| 3,810,016 | 5/1974 | Chayka et al. .......... | 324/158 F |
| 4,132,946 | 1/1979 | Holdren et al. ......... | 324/158 P |
| 4,649,339 | 3/1987 | Grangroth et al. ...... | 324/158 F |
| 4,835,469 | 5/1989 | Jones et al. ............ | 324/158 P |

FOREIGN PATENT DOCUMENTS 9379  1/1989  Japan .................. 324/158 F

*Primary Examiner*—Reinhard J. Eisenzopf
*Assistant Examiner*—Vinh P. Nguyen
*Attorney, Agent, or Firm*—John D. Winkelman; John Smith-Hill

[57] ABSTRACT

A probe includes a flexible sheet of dielectric material having an opening therein sized and shaped to receive an electronic component mounted on a support member at a major surface thereof, a contact pad exposed at a first main face of the sheet and adjacent the opening therein, and a conductor connecting the contact pad to a terminal of the probe. The probe is positioned with its first main face in confronting relationship with the major surface of the support member and with the opening in the sheet in registration with the electronic component, and pressure is applied to the flexible sheet to bring the contact pad into contact with the test point.

8 Claims, 1 Drawing Sheet

PROBE AND METHOD FOR TESTING A POPULATED CIRCUIT BOARD

Cross Reference to Related Application

This is a continuation-in-part of co-pending Application Ser. No. 07/338,712 filed Apr. 14, 1989.

Background of the Invention

This invention relates to a probe and method for testing a populated circuit board.

A populated circuit board comprises a support member and at least one electronic component mounted on the support member.

It is at present conventional to test a populated circuit board by connecting individual probes to the leads of the component, and using a test instrument to observe the voltage waveforms existing at those leads. The probes are connected to the leads of the component by mechanically gripping the leads. This technique is not suitable for use with a component that is surface mounted on the support member, because a surface mounted component does not generally have leads that can be readily gripped, and in any event the leads are too close together to be gripped without risk of causing a short circuit between the leads. Furthermore, it is not normally feasible to test a populated circuit board when installed in its operating environment by use of gripping probes, because of space constraints.

The co-pending application referred to above describes a probe that comprises a flexible sheet of dielectric material, contact pads on a first surface of the sheet, and conductor runs connecting the contact pads to terminals of the probe. The pattern of contact pads on the first surface of the sheet corresponds to the pattern of test points on a circuit board to be tested. In use of the probe, the flexible sheet is positioned with its first surface in confronting relationship with the circuit board and the pattern of contact pads in registration with the pattern of test points. Pressure is applied to the flexible sheet, whereby the contact pads are brought into contact with the test points respectively.

The probe described in the co-pending application avoids the problems discussed above in testing a populated circuit board. However, this probe is nevertheless subject to disadvantage, in that it is not suitable for testing a circuit board when the test point is close to a component that is substantially higher than the test point, since engagement of the flexible sheet with the component interferes with establishment of reliable contact between the contact pad of the probe and the test point of the board.

Summary of the Invention

A preferred embodiment of the present invention in a first aspect is a probe for testing a populated circuit board comprising a support member having a major surface and an electronic component projecting from the major surface of the support member, the circuit board having a test point adjacent the component, and the test point having a top surface that is closer to the major surface of the circuit board than is the top surface of the electronic component. The probe comprises a sheet of dielectric material having an opening therein sized and shaped to receive the electronic component, a contact pad exposed at a first main face of the sheet, and a conductor connecting the contact pad to a terminal of the probe.

A preferred embodiment of the present invention in a second aspect is a probe comprising a flexible sheet of dielectric material having an opening therein sized and shaped to receive an electronic component mounted on a support member at a major surface thereof, a contact pad exposed at a first main face of the sheet and adjacent the opening therein, and a conductor connecting the contact pad to a terminal of the probe. The probe is positioned with its first main face in confronting relationship with the major surface of the support member and with the opening in the sheet in registration with the electronic component, and pressure is applied to the flexible sheet to bring the contact pad into contact with the test point.

Brief Description of the Drawings

For a better understanding of the invention, and to show how the same may be carried into effect, reference will now be made, by way of example, to the accompanying drawings in which.

Detailed Description

Figure 1:
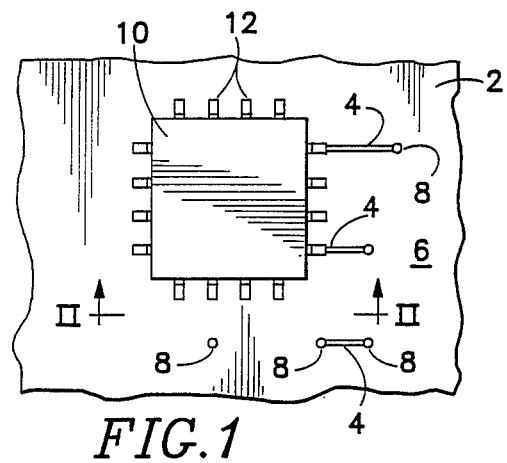
FIG. 1 is a partial top plan view of a populated circuit board.
Figure 2:
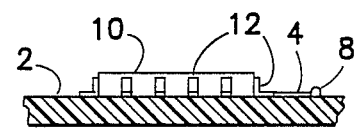
FIG. 2 is a sectional view taken on the line II—II of FIG. 1.

The circuit board shown in FIG. 1 comprises a support member 2 composed of multiple layers of dielectric material, typically epoxy glass, inner layer conductor runs (not shown) between the layers of dielectric material, and surface runs 4 on the top surface 6 of the support member. The conductor runs terminate at pads 8, and the runs at different levels are interconnected by vias, which are metal columns extending through the support member and intercepting the runs at the pads. The circuit board also comprises a surface mounted integrated circuit 10 having leads 12 that are connected to pads on surface 6. In order to test the circuit board, it is necessary to make electrical contact to the leads of the IC and to other test points on the top surface of the support member.

Figure 3:
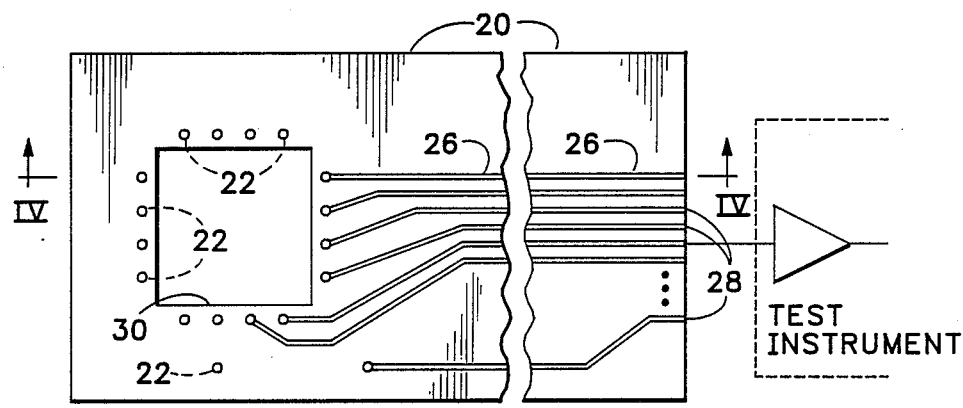
FIG. 3 is a top plan view or a probe for use in testing the circuit board shown in FIG. 1.
Figure 4:
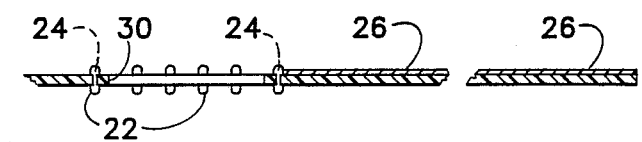
FIG. 4 is a sectional view taken on the line IV—IV of FIG. 3.
Figure 5:
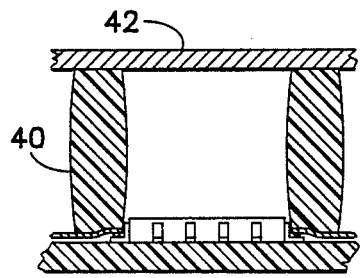
FIG. 5 is a sectional view illustrating use of the FIG. 3 probe in testing the FIG. 1 circuit board.

The probe illustrated in FIGS. 3–5 comprises a sheet 20 of transparent flexible dielectric material, such as polyimide, having metal contact pads 22 on its lower surface. These contact pads are connected through vias 24 to conductor runs 26 which extend over the upper surface of sheet 20 to terminals 28 at one edge of the sheet. Only representative, conductor runs 26 are shown in the drawings. An edge connector (not shown) may be applied to the edge of the sheet for connecting the terminals to a test instrument.

The pattern of contact pads 22 on the lower surface of sheet 20 corresponds to the pattern of test points constituted by a selected set of pads 8 and leads 12. A hole 30 is defined in sheet 20 at a predetermined position relative to the pattern of contact pads 22. The probe is positioned with the pattern of contact pads 22 in registration with the pattern of test points. When the probe is so positioned, the package of IC 10 extends within hole 30. Accordingly, IC 10 does not interfere with establishment of reliable pressure contact between the contact pads and the test points. The probe is attached to the board, for example by use of adhesive tape, and by application of pressure to the upper surface of the probe, the contact pads are brought into reliable pressure contact with the test points of the circuit board and the circuit board can be tested.

As shown in FIG. 5, pressure may be applied to the probe by use of a body 40 of resiliently compressible dielectric material, also formed with a hole to receive IC 10. Body 40 is mounted on the underside of a rigid plate 42, and the plate is positioned so that the hole in body 40 is in registration with hole 30 in the probe and therefore receives IC 10 when the body is compressed so that the IC does not interfere with application of pressure to the upper surface of the probe. Of course, this type of pressure mechanism requires fairly accurate positioning of the plate relative to the board and the probe. Alternatively, if the resilient material is chosen to be sufficiently soft and yieldable, the need for a hole in the body to receive the IC is avoided. Yet again, pressure may be applied to the probe by placing an inflatable bladder between the probe and a back-up plate which is stationary relative to the board, and inflating the bladder so that it applies pressure to the probe, as described in the copending application.

Figure 6:
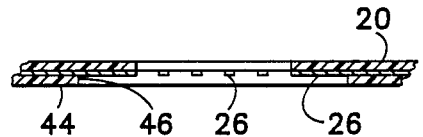
FIG. 6 illustrates a modification of the FIG. 3 probe.

In a further modification, shown in FIG. 6, conductor runs 26 are provided on the lower surface of sheet 20 and are covered by a second sheet 44 of dielectric material to maintain electrical isolation from the circuit board. Sheet 44 is formed with a hole 46 so that the ends of conductor runs 26, which form the contact pads of the probe, are exposed.

It will be appreciated that the invention is not restricted to the particular embodiments that have been described, and that variations may be made therein without departing from the scope of the invention as defined in the appended claims and equivalents thereof.

We claim:

1. A probe for testing a populated circuit board that comprises a support member having a major surface, and an electronic component which is mounted on the support member at the major surface thereof and has a topp surface spaced from the major surface of the support member, the circuit board having a test point exposed at the major surface adjacent said component, the test point having a top surface that is closer to the major surface of the circuit board than is the top surface of the electronic component, said probe comprising a flexible sheet of dielectric material having first and second main faces and formed with an opening extending therethrough and sized and shaped to receive the electronic component, at least one contact pad exposed at the first main face of the flexible sheet, and at least one conductor run adhered to the flexible sheet and connecting the contact pad to a probe terminal.

2. A probe according to claim 1, wherein the probe comprises a plurality of contact pads exposed at the first main face of the flexible sheet about the opening in the sheet in a predetermined pattern, and a plurality of conductors adhered to the flexible sheet and connecting the contact pads to respective probe terminals, so that when the first main face of the probe is placed in confronting relationship with a circuit board that has a plurality of test points exposed at the major surface thereof and distributed about an electronic component in a pattern that corresponds to the pattern of contact pads on the first main face of the flexible sheet, the contact pads can be brought into contact with the test points respectively, 3. A probe according to claim 1, wherein the conductor run extends over said first main face of the sheet of dielectric material, and the probe further comprises a second flexible sheet of dielectric material covering the conductor run.

4. A probe according to claim 1, wherein the conductor extends over the second main face of the sheet of dielectric material.

5. A probe according to claim 1, wherein the sheet of dielectric material is transparent.

6. A method of testing a populated circuit board that comprises a support member having a major surface, and an electronic component mounted on the support member at the major surface thereof and having a top surface spaced from the major surface of the support member, the circuit board having a test point adjacent said component, the test point having a top surface that is closer to the major surface of the circuit board than is the top surface of the electronic component, the method comprising:

providing a probe comprising a flexible sheet of dielectric material having an opening extending therethrough and sized and shaped to receive the electronic component, a contact pad exposed at a first main face of the sheet and adjacent the opening therein, and a conductor run adhered to the flexible sheet and connecting the contact pad to a terminal of the probe, positioning the probe with the first main face of the flexible sheet in confronting relationship with the major surface of the support member and with the opening in the sheet in registration with the electronic component, and applying pressure to a second main face of the flexible sheet, opposite the first main face thereof, whereby the contact pad is brought into contact with the test point.

7. In combination:

a populated circuit board comprising a support member having a major surface and an electronic component mounted on the support member at the major surface thereof, the circuit board having a plurality of test points exposed at the major surface at predetermined positions relative to said component, and apparatus for testing the circuit board, the apparatus comprising:

a probe comprising a flexible sheet of dielectric material having first and second main faces and formed with an opening extending therethrough and sized and shaped to receive the electronic component, contact pads exposed at the first main face of the sheet at positions relative to the opening corresponding to the positions of the test points relative to the electronic component, and conductor runs adhered to the flexible sheet and connecting the contact pads to probe terminals, means for applying pressure to the probe when the probe is positioned with the first surface of the sheet in confronting relationship with the circuit board and the opening in the sheet is in registration with the electronic component, whereby the contact pads are brought into contact with the test points respectively, and a test instrument connected to the terminals of the probe for observing electrical signals transmitted from the test points by the probe.

8. A combination according to claim 7 wherein the conductor runs and adhered to said first main face of the sheet of dielectric material, and the probe further comprises a second flexible sheet of dielectric material covering the conductor runs.

* * * * *

UNITED STATES PATENT AND TRADEMARK OFFICE
CERTIFICATE OF CORRECTION

PATENT NO. : 4,963,821

DATED : October 16, 1990

INVENTOR(S) : Bozidar Janko, Zoran O. Sekulic, Mark F. Bitetto

It is certified that error appears in the above-identified patent and that said Letters Patent is hereby corrected as shown below:

Col. 3, line 45, "topp" should read "top".

Col. 5, line 5, "and" should read "are".

Signed and Sealed this

Twenty-eighth Day of January, 1992

Attest:

HARRY F. MANBECK, JR.

Attesting Officer

Commissioner of Patents and Trademarks

UNITED STATES PATENT AND TRADEMARK OFFICE
CERTIFICATE OF CORRECTION

PATENT NO. : 4,963,821

DATED : October 16, 1990

INVENTOR(S) : Bozidar Janko, Zoran O. Sekulic, Mark F. Bitetto

It is certified that error appears in the above-identified patent and that said Letters Patent is hereby corrected as shown below:

On the cover page of the patent, the entry for field [73] should read as follows:

Assignees: Tektronix, Inc., Beaverton, Oregon
Boeing Company, Seattle, Washington Signed and Sealed this Thirty-first Day of March, 1992

Attest:

HARRY F. MANBECK, JR.

*Attesting Officer*  *Commissioner of Patents and Trademarks*